(12) United States Patent
Gladish et al.

(10) Patent No.: US 8,829,624 B2
(45) Date of Patent: Sep. 9, 2014

(54) POWER DEVICE WITH MONOLITHICALLY INTEGRATED RC SNUBBER

(75) Inventors: Jon Gladish, Forty Fort, PA (US); Arthur Black, Sunnyvale, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 71 days.

(21) Appl. No.: 12/492,101

(22) Filed: Jun. 25, 2009

(65) Prior Publication Data

US 2010/0163950 A1 Jul. 1, 2010

Related U.S. Application Data

(60) Provisional application No. 61/077,070, filed on Jun. 30, 2008.

(51) Int. Cl.
| | | |
|---|---|---|
| H01L 27/088 | (2006.01) | |
| H01L 27/06 | (2006.01) | |
| H01L 29/78 | (2006.01) | |
| H03K 17/16 | (2006.01) | |
| H01L 29/66 | (2006.01) | |
| H01L 29/423 | (2006.01) | |
| H01L 29/417 | (2006.01) | |
| H01L 29/06 | (2006.01) | |
| H01L 29/40 | (2006.01) | |

(52) U.S. Cl.
CPC ........ *H03K 17/162* (2013.01); *H01L 29/42368* (2013.01); *H01L 29/7835* (2013.01); *H01L 29/4175* (2013.01); *H01L 29/7803* (2013.01); *H01L 29/4238* (2013.01); *H01L 29/0696* (2013.01); *H01L 29/402* (2013.01); *H01L 29/7806* (2013.01); *H01L 29/66181* (2013.01); *H01L 29/407* (2013.01); *H01L 29/7817* (2013.01); *H01L 29/7813* (2013.01)

USPC .............. 257/401; 257/302; 257/E27.033; 257/E27.045

(58) Field of Classification Search
CPC .............. H01L 29/66181; H01L 29/7803; H01L 29/7813; H01L 29/7817
USPC .......... 257/302, 401, 328, E27.016, E27.033, 257/E27.045; 361/91.7
See application file for complete search history.

(56) References Cited

U.S. PATENT DOCUMENTS

| | | | |
|---|---|---|---|
| 4,399,449 | A | 8/1983 | Herman et al. |
| 4,455,565 | A | 6/1984 | Goodman et al. |

(Continued)

FOREIGN PATENT DOCUMENTS

| | | |
|---|---|---|
| EP | 1170803 A2 | 9/2002 |
| JP | 63-296282 A | 12/1988 |

OTHER PUBLICATIONS

Berberich, S.E., "High Voltage 3D-Capacitor", Sep. 2-5, 2007, 2007 European Conference on Power Electronics and Applications, pp. 1-9.*

(Continued)

*Primary Examiner* — Mark Tornow
*Assistant Examiner* — Abbigale Boyle

(57) ABSTRACT

In one general aspect, a semiconductor structure can include a power transistor including a body region extending in a silicon region, a gate electrode insulated from the body region by a gate dielectric, a source region extending in the body region where the source region is of opposite conductivity type from the body region, a source interconnect contacting the source region, and a backside drain. The semiconductor structure can include an RC snubber monolithically integrated with the power transistor in a die. The RC snubber can include a snubber electrode insulated from the silicon region by a snubber dielectric such that the snubber electrode and the silicon region form a snubber capacitor.

31 Claims, 10 Drawing Sheets

(56) References Cited

U.S. PATENT DOCUMENTS

| | | | |
|---|---|---|---|
| 4,941,026 | A | 7/1990 | Temple |
| 5,179,032 | A | 1/1993 | Quigg |
| 5,429,964 | A | 7/1995 | Yilmaz et al. |
| 5,763,915 | A | 6/1998 | Hshieh et al. |
| 5,898,198 | A | 4/1999 | Herbert et al. |
| 5,912,490 | A | 6/1999 | Hebert et al. |
| 5,918,137 | A | 6/1999 | Ng et al. |
| 5,998,833 | A | 12/1999 | Baliga |
| 6,150,675 | A | 11/2000 | Franke et al. |
| 6,351,018 | B1 * | 2/2002 | Sapp ............................ 257/499 |
| 6,437,386 | B1 * | 8/2002 | Hurst et al. .................. 257/301 |
| 6,600,182 | B2 | 7/2003 | Rumennik |
| 6,653,691 | B2 | 11/2003 | Baliga |
| 6,683,346 | B2 | 1/2004 | Zeng |
| 6,750,508 | B2 | 6/2004 | Omura et al. |
| 6,870,220 | B2 | 3/2005 | Kocon et al. |
| 6,891,223 | B2 | 5/2005 | Krumrey et al. |
| 6,987,305 | B2 * | 1/2006 | He et al. ........................ 257/417 |
| 2002/0036326 | A1 | 3/2002 | DeJong et al. |
| 2004/0157384 | A1 | 8/2004 | Blanchard |
| 2004/0196679 | A1 * | 10/2004 | Apeland et al. ............... 363/132 |
| 2005/0056886 | A1 | 3/2005 | Tihanyi |
| 2005/0167742 | A1 | 8/2005 | Challa et al. |
| 2006/0071276 | A1 * | 4/2006 | Zundel et al. ................. 257/355 |
| 2006/0273379 | A1 | 12/2006 | Bhalla et al. |
| 2006/0275993 | A1 * | 12/2006 | Fong ............................. 438/300 |
| 2007/0138548 | A1 | 6/2007 | Kocon et al. |
| 2007/0274014 | A1 * | 11/2007 | Berberich et al. ........... 361/91.7 |
| 2008/0017920 | A1 | 1/2008 | Sapp et al. |

OTHER PUBLICATIONS

"Design of Snubbers for Power Circuits" R Severns, EMI-Reduce-International Rectifier Corportaion, 2006.*

Non-Final Office Action for U.S. Appl. No. 11/620,002, mailed on Sep. 17, 2009, 11 pages.

* cited by examiner

POWER DEVICE WITH MONOLITHICALLY INTEGRATED RC SNUBBER

CROSS-REFERENCES TO RELATED APPLICATIONS

This application claims the benefit of U.S. Provisional Appln. No. 61/077,070, filed Jun. 30, 2008, which disclosure is incorporated herein by reference in its entirety for all purposes.

BACKGROUND

An RC snubber is a fundamental building block of a switching circuit. It is generally used to control excessive peak voltage stress and EMI created during switching. For example, the RC snubber is a standard design element in many synchronous buck regulators. In such applications, uncontrolled ringing can exceed the FET breakdown voltage rating.

FIG. 1 shows a circuit model of a DrMOS (driver MOS) which includes a high-side FET (HS_FET) 110 and a low-side FET (LS_FET) 108. The parasitic elements for the LS_FET are shown. HS_FET 110 has similar parasitics (not shown). The inductors represent inductances associated with bond wires and package pins. In such applications, the ringing at the output during a switching event can cause excessive voltage over-shoot, high frequency ringing, and EMI noise radiated from the circuit. In this particular example, LS_FET 108 is rated for 25V VDSS. The Peak VDSS ring voltage across LS_FET 108, as measured at the VSWH node is 24.5 V, almost at the rated limit for the FET.

The output ringing characteristics are determined by the FET parasitic capacitance and the sum of the inductances from the package plus board inductance. The combination creates an LC resonance, with very light damping. It is common in compact form factor circuits such as DrMOS to see HF ringing approaching 150 MHz at HS_FET turn on, and 300 MHz at HS_FET turn off. This HF noise can cause the circuit to fail standards due to excessive radiated EMI.

To control output ringing, external RC snubber 104 is typically added on the PCB. Snubber 104 includes RC components coupled to the PCB as discrete components. RC snubber 104 is added to shunt the ring current away from internal path 106 through the FET and provide damping. However, in typical FET circuits, due to the mixture of internal and external parasitic impedances, the shunt is only moderately effective. In most cases, the ring voltage is still relatively close to device peak voltage rating. Thus, external snubber performance is limited by the ability to tightly couple the RC snubber across the output capacitance of the FET. This is particularly a concern in circuits with fast switching action, such as a synchronous buck regulator or motor driver. A typical solution would be to slow down turn on of the HS_FET, but this will incur the penalty of reduced circuit efficiency, and would still not reduce high-side ringing.

Thus, there is a need for a low cost and effective technique for damping the output ringing when switching power transistors.

SUMMARY

In accordance with an embodiment of the invention, a semiconductor structure includes a power transistor monolithically integrated with a RC snubber in a die. The power transistor includes body regions extending in a silicon region, gate electrodes insulated from the body region by a gate dielectric, source regions extending in the body regions, the source and the body regions being of opposite conductivity type, and a source interconnect contacting the source regions. The RC snubber comprises including snubber electrodes insulated from the silicon region by a snubber dielectric such that the snubber electrodes and the silicon region form a snubber capacitor having a predetermined value. The snubber electrodes are connected to the source interconnect in a manner so as to form a snubber resistor of a predetermined value between the snubber capacitor and the source interconnect. The snubber capacitor and the snubber resistor are configured to substantially dampen output ringing when the power transistor switches states.

In one embodiment, the semiconductor further includes a plurality of gate trenches each includes a gate electrode, and a plurality of snubber trenches each including a snubber electrode.

In another embodiment, the snubber trenches and gate trenches extend parallel to each other along rows, the structure further including at least two columns of contacts for bringing the source interconnect and the snubber electrodes into contact with one another.

In another embodiment, each gate trench includes a shield electrode under the gate electrode.

In another embodiment, the snubber trenches extend deeper than the gate trenches.

In another embodiment, the snubber trenches and the gate trenches extend to the same depth, and a dielectric layer extending along the bottom of each gate trench is thicker than a dielectric layer extending along the bottom of each snubber trench.

In another embodiment, the snubber trenches and gate trenches extend along parallel rows, and the rows of snubber trenches are dispersed among the rows of gate trenches.

In another embodiment, the power transistor is formed in an entirely separate part of the die from the RC snubber.

In another embodiment, the power transistor is formed in an active region of the die, and the RC snubber is formed in a region extending under a gate pad that is electrically connected to the gate electrodes.

In another embodiment, the gate electrodes and the snubber electrodes laterally extend over but are insulated from a top surface of the silicon region.

In another embodiment, the snubber resistance is in the range of 0.5 to 2.0 Ohms.

In another embodiment, the snubber resistor has a value proportional to $\sqrt{L/C}$, where C represents the output capacitance of the power transistor when turned off, and L includes the parasitic inductance of a package in which the semiconductor structure is housed.

In another embodiment, the snubber capacitor has a value greater than the output capacitance of the power transistor when turned off.

In accordance with another embodiment of the invention, a multi-chip module includes a high-side switch having a high-side power transistor and a high-side RC snubber monolithically integrated in a first die, wherein the high-side power transistor includes a high-side drain interconnect, a high-side source interconnect, and a high-side gate interconnect, and the high-side RC snubber includes a high-side snubber capacitor and a high-side snubber resistor serially coupled between the high-side drain interconnect and the high-side source interconnect so as to substantially dampen output ringing when the high-side switch changes states. The multi-chip module further includes a low-side switch having a low-side power transistor and a low-side RC snubber monolithically integrated in a second die, the high-side and low-side switches being serially coupled, wherein the low-side power transistor includes a low-side drain interconnect, a low-side source interconnect, and a low-side gate interconnect, and the low-side RC snubber includes a low-side snubber capacitor and a low-side snubber resistor serially coupled between the low-side drain interconnect and the low-side source interconnect so as to substantially dampen output ringing when the low side power transistor switches states.

In one embodiment, the high-side power transistor further comprises: body regions extending in a drain region, the high-side drain interconnect contacting the drain region; gate electrodes insulated from the body region by a gate dielectric, the high-side gate interconnect contacting the gate electrodes; and source regions extending in the body regions, the source and the body regions being of opposite conductivity type, the high-side source interconnect contacting the source regions. The high-side RC snubber further comprises snubber electrodes insulated from the drain region by a snubber dielectric such that the snubber electrodes and the drain region form the high-side snubber capacitor, the snubber electrodes being connected to the high-side source interconnect in a manner so as to form the high-side snubber resistor.

In another embodiment, the low-side power transistor further comprises: body regions extending in a drain region, the low-side drain interconnect contacting the drain region; gate electrodes insulated from the body region by a gate dielectric, the low-side gate interconnect contacting the gate electrodes; and source regions extending in the body regions, the source and the body regions being of opposite conductivity type, the low-side source interconnect contacting the source regions. The low-side RC snubber further comprises snubber electrodes insulated from the drain region by a snubber dielectric such that the snubber electrodes and the drain region form the low-side snubber capacitor, the snubber electrodes being connected to the low-side source interconnect in a manner so as to form the low-side snubber resistor.

The following detailed description and the accompanying drawings provide a better understanding of the nature and advantages of the present invention.

DETAILED DESCRIPTION OF THE INVENTION

In accordance with embodiments of the invention, an RC snubber is monolithically integrated with a power transistor in a single die. In one embodiment, the power transistor includes a drain interconnect, a source interconnect, and a gate interconnect. The RC snubber includes a snubber resistor and a snubber capacitor serially coupled between the drain interconnect and the source interconnect. The snubber capacitor and the snubber resistor are designed to have pre-selected values so as to dampen output ringing that occurs when the power transistor switches states.

Figure 1:
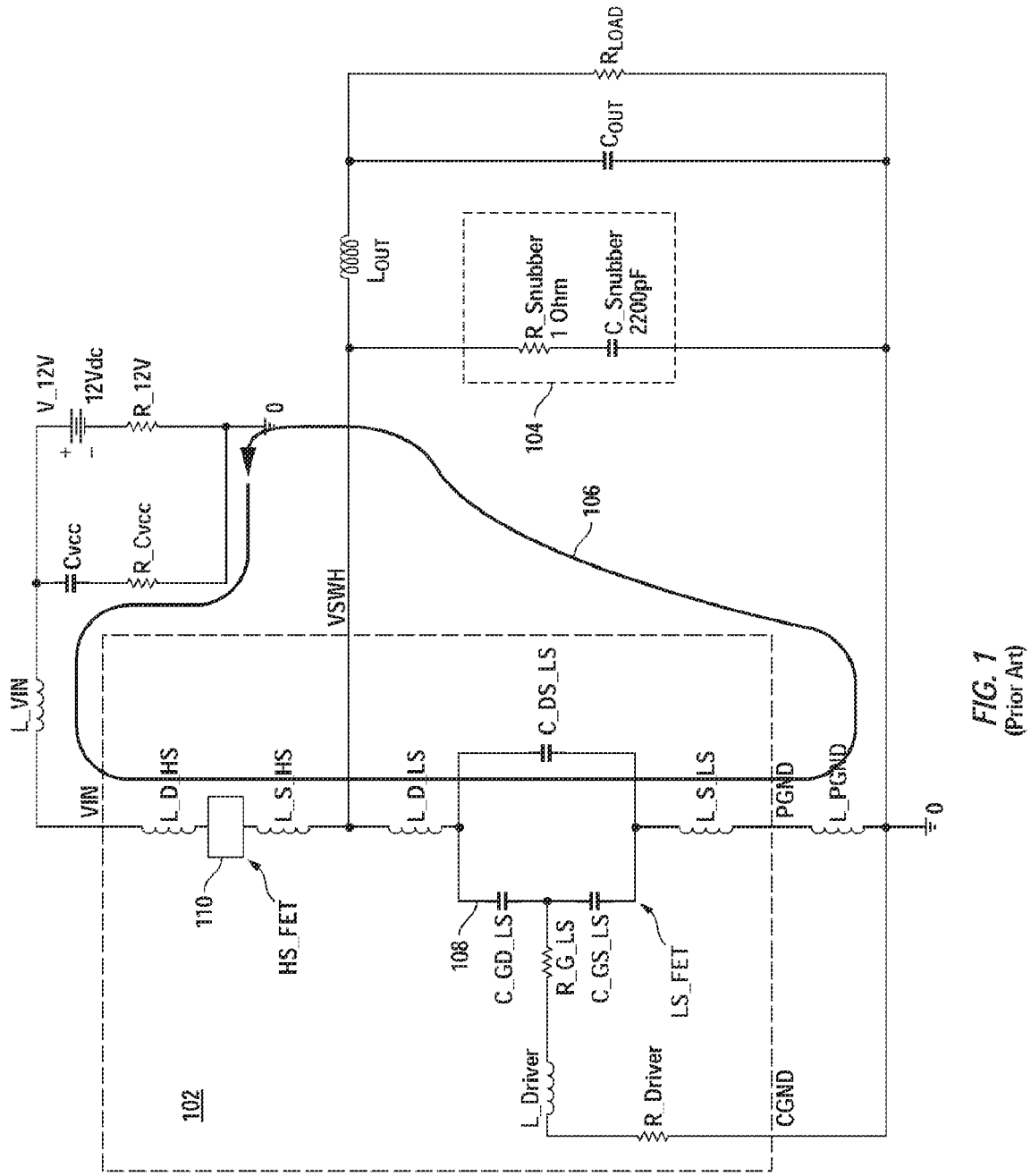
FIG. 1 shows a circuit representation of a DrMOS with an externally provided RC snubber.
Figure 2:
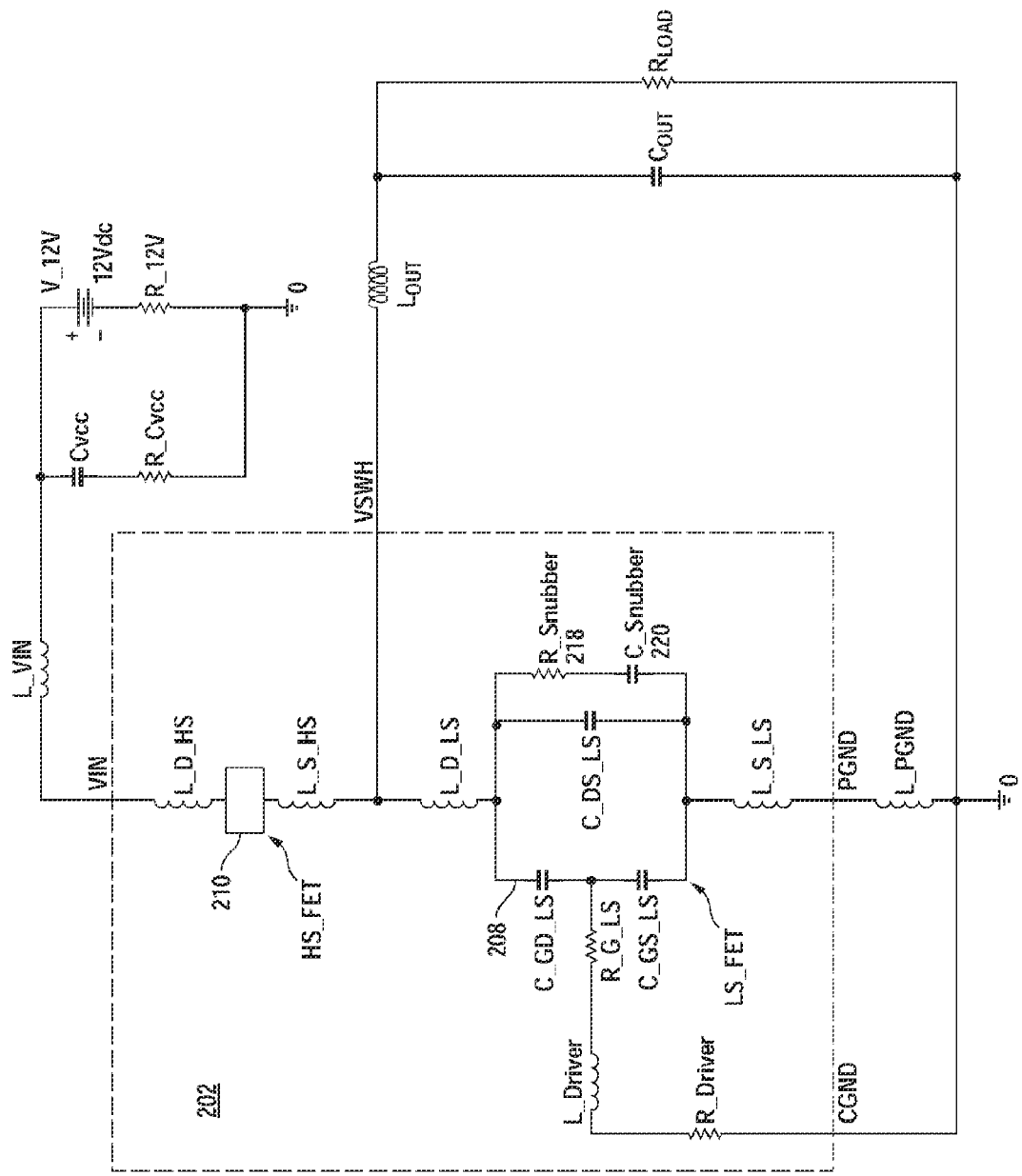
FIG. 2 shows a circuit representation of a DrMOS where the RC snubber is monolithically integrated within the LS_FET, in accordance with an embodiment of the invention.

FIG. 2 shows a circuit representation of a DrMOS where the RC snubber is monolithically integrated within the LS_FET, in accordance with an embodiment of the invention. Though not shown, an RC snubber can also be integrated within the HS_FET in a similar manner. Block 202 represents the package that houses the multi-die DrMOS. The low side FET LS_FET 208 together with its RC snubber are monolithically formed in one die, and the high side FET HS_FET 210 and its RC snubber are monolithically formed in a separate die. The parasitic elements of LS_FET 208, including output capacitance C_DS_LS, gate to source capacitance C_GS_LS and gate to drain capacitance C_GD_LS are shown. The inductors coupled to LS_FET 208 represent the inductance associated with gate, source and drain bond wires. The RC snubber for LS_FET 208 includes R_Snubber 218 and C_Snubber 220 serially connected between the drain and source of LS_FET. As can be seen, monolithic integration of the RC snubber enables coupling the RC snubber directly across the output capacitance C_DS_LS of LS_FET 208. The monolithic RC snubber thus advantageously bypasses all significant parasitic package inductance, and also eliminates the need for discrete R and C components that would make up the external snubber. This is particularly useful for applications and environments where a known LC is present, such as MCMs (multi-chip modules) as the known LC allows fine tuning the RC snubber to more effectively suppress the output ringing. In another embodiment, the low side FET LS_FET 208 and its RC snubber as well as the high side FET HS_FET 210 and its RC snubber are all monolithically formed in a single die.

Figure 3A:
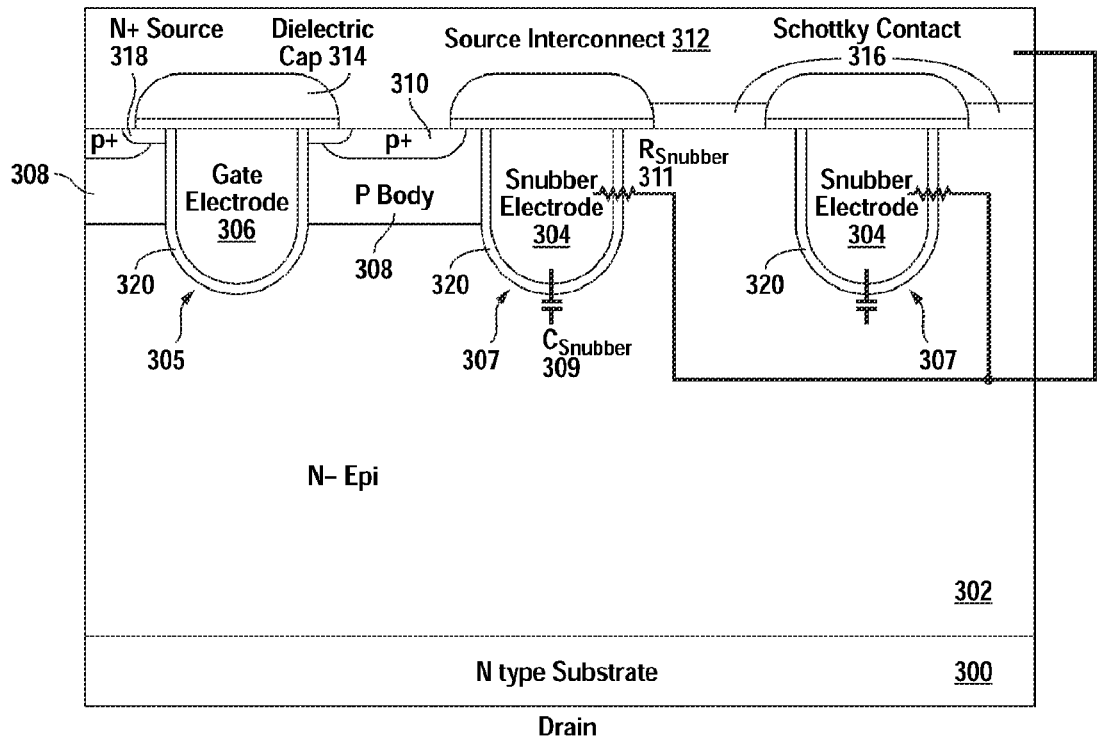
FIG. 3A shows a cross section view of a Synchronous FET (Sync FET) with a monolithically integrated RC snubber, in accordance with an embodiment of the invention.
Figure 3B:
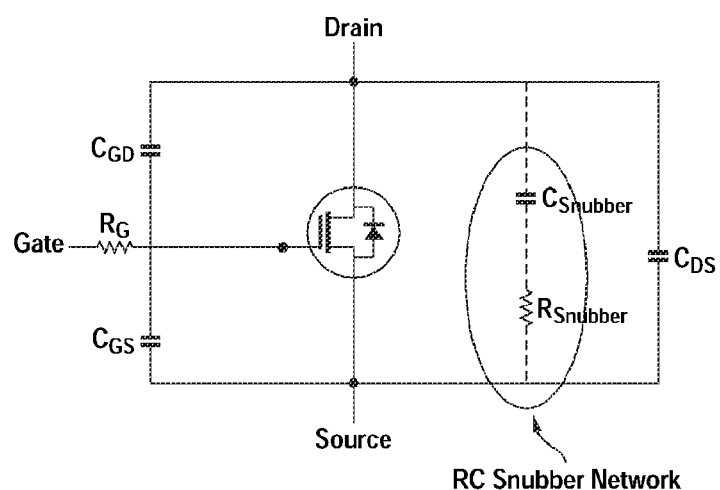
FIG. 3B shows the circuit representation of the Sync FET in FIG. 3A.

FIG. 3A shows a cross section view of a Synchronous FET (Sync FET) with a monolithically integrated RC snubber, in accordance with an embodiment of the invention. FIG. 3B shows the circuit representation of the Sync FET in FIG. 3A, with its input (CGD, CGS, RG) and output (CDS) parasitic elements. The Sync FET in FIG. 3A could be used as the low side FET and/or the high side FET in FIG. 2. In FIG. 3A, far left trench 305 represents the FET trench and right two trenches 307 represent the Schottky trenches. Many more such trenches are typically present in the die in which the Sync FET is formed. FET trenches 305 and Schottky trenches 307 are lined with a dielectric layer 320 and then filled with a conductive electrode such as polysilicon. The conductive electrode forms gate electrode 306 in FET trenches 305 and snubber electrode 304 in Schottky trenches 307.

Trenches 305 and 307 extend into n-type silicon region 302 which extends over substrate 300. Silicon region 302 may be an epitaxial layer that is formed over substrate 300. P-type body regions 308 extend into silicon region 302 between adjacent FET trenches 305. As can be seen, body regions are omitted from mesa regions between adjacent Schottky trenches 307 thereby enabling formation of Schottky contacts 316 between source interconnect 312 and silicon region 302. Source interconnect 312 comprises suitable known material for forming Schottky contacts with silicon region 302. Source regions 318 extend in body regions 308 and flank each FET trench 305. Heavy body regions 310 extend in body regions 308 between adjacent source regions 318. Top side source interconnect 312 contacts source regions 318 and heavy body regions 310, but is insulated from gate electrodes 306 and snubber electrodes 304 by dielectric cap 314. A backside drain interconnect (e.g., comprising metal), not shown, contacts the backside of substrate 300.

In FIG. 3A, each snubber electrode 304 and n-type silicon region 302 with dielectric layer 320 extending therebetween form part of a distributed snubber capacitor 309. Snubber electrode 304 in Schottky trenches 307, unlike in conventional Sync FETs where they are directly tied to source interconnect 312, are connected to source interconnect 312 in a third dimension in a manner so as to form snubber resistor 311 with the desired resistance value. Schottky trenches 307 as well as dielectric layer 320 and snubber electrode 304 are thus designed (e.g., by selecting an appropriate number of snubber trenches, snubber trench widths/depths and doping concentration for the polysilicon snubber electrode, and the location and the manner in which the polysilicon snubber electrodes are connected to source interconnect 312) to ensure that the resulting RC snubber properly dampens the output ringing during switching.

The RC snubber may be implemented in conventional trench gate FETs (i.e., with no Schottky regions) by using dummy trenches instead of Schottky trenches 307. The dummy trenches would have a similar structure to Schottky trenches 307 except the mesa surfaces between the dummy trenches would be insulated from source interconnect 312.

Figure 4A:
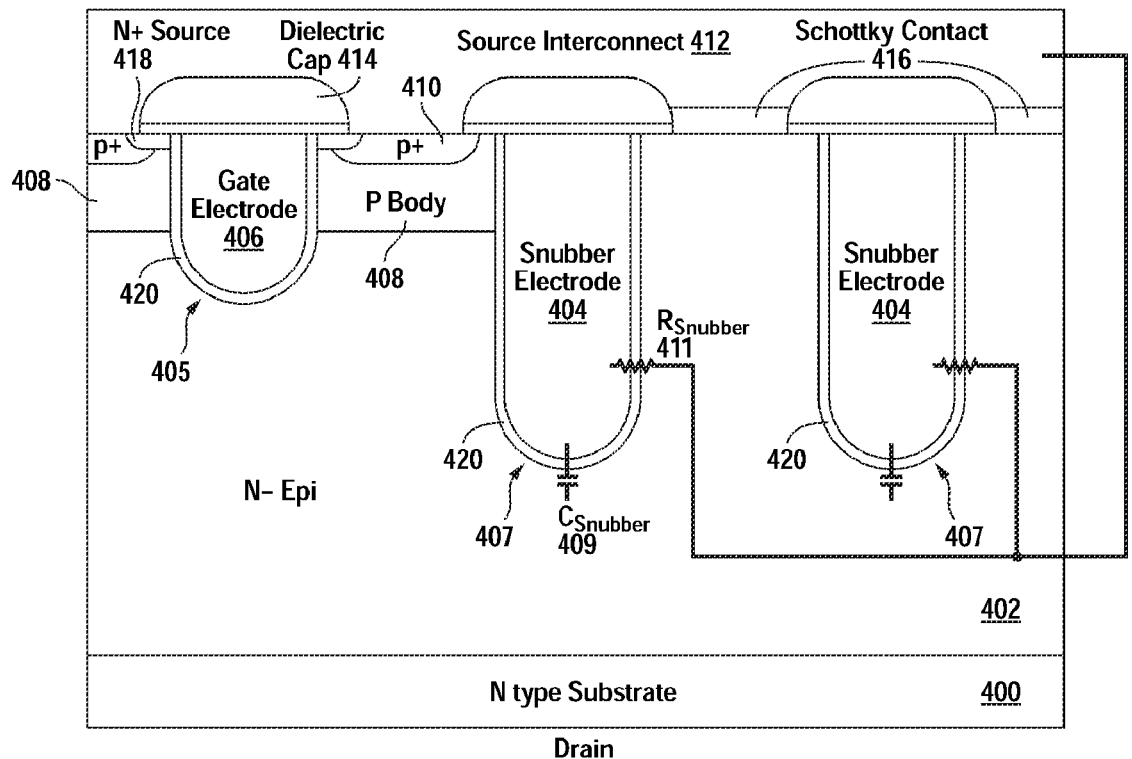
FIG. 4A shows a variation of the Sync FET in FIG. 3A where the Schottky trenches are extended deeper into the silicon region.
Figure 4B:
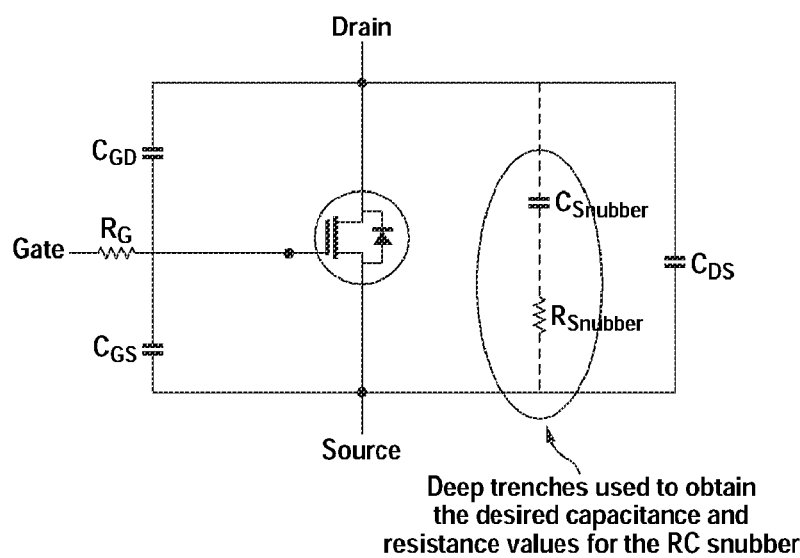
FIG. 4B shows the circuit representation of the Sync FET in FIG. 4A.

FIG. 4A shows a variation of the Sync FET in FIG. 3A where Schottky trenches 407 are extended deeper into silicon region 402 than FET trenches 405. Otherwise the Sync FET in FIG. 4A is similar to that in FIG. 3A, and thus structural features of the Sync FET in FIG. 4A will not be described. FIG. 4B shows the circuit representation of the Sync FET in FIG. 4A, with its input ($C_{GS}$, $C_{GS}$, $R_G$) and output ($C_{DS}$) parasitic elements. The depth of Schottky trenches 407 may be adjusted as needed in order to obtain the desired capacitance and resistance values for the RC snubber. Similar to the FIG. 3A embodiment, gate electrodes 406 and snubber electrodes 404 may be recessed in the respective trenches. Also, a trench gate FET variation of the Sync FET can be obtained by using dummy trenches with similar structure to Schottky trenches 407, and by eliminating the contact between source interconnect 412 and the mesa surfaces.

Figure 5:
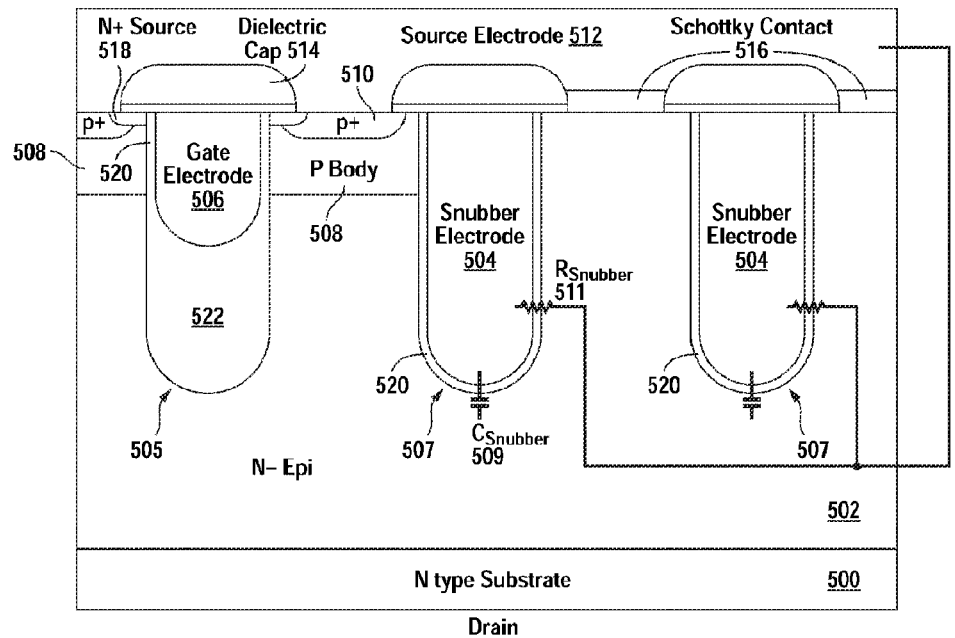
FIG. 5 shows yet another variation of the FIG. 3A embodiment.

FIG. 5 shows yet another variation of the FIG. 3A embodiment where both the FET and Schottky trenches 505, 507 are extended deeper into silicon region 502, but a thicker dielectric 522 is formed along the bottom of FET trenches 505 than dielectric 520 that lines Schottky trenches 507. Otherwise the Sync FET in FIG. 4A is similar to that in FIG. 3A, and thus structural features of the Sync FET in FIG. 4A will not be described. This embodiment advantageously enables adjusting the depth of the FET and Schottky trenches to obtain the desired RC values for the RC snubber without the need for forming FET and Schottky trenches of different depths. Depending on the desired trench depth, a thicker or thinner dielectric material is formed along the bottom of FET trenches 505. Further, thick bottom dielectric 522 along the bottom of FET trenches 505 helps minimize the gate to drain capacitance. Once again the conductive electrodes 504, 506 can be recessed in the trenches, and dummy trenches may be used instead of Schottky trenches.

Figure 6:
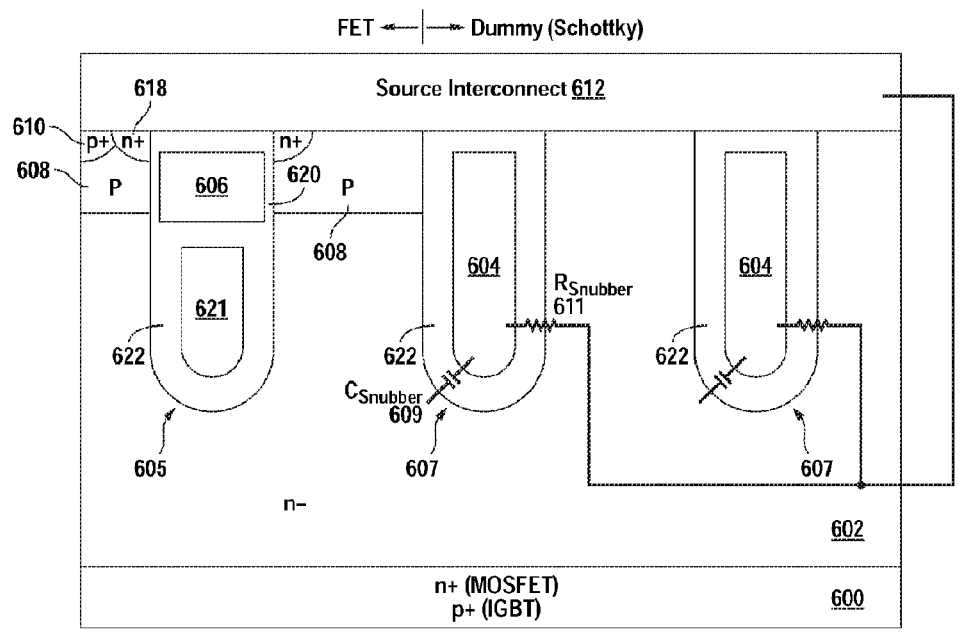
FIG. 6 shows a shielded gate FET with integrated RC snubber, according to another embodiment of the invention.

FIG. 6 shows a shielded gate FET with integrated RC snubber, according to another embodiment of the invention. A conventional shielded gate FET structure (left side of FIG. 6) is combined with a Schottky structure and RC snubber (right side of FIG. 6). The FET portion of the Sync FET in FIG. 6 is similar to that in FIG. 3A, except that all trenches extend deeper in silicon region 602 and a shield electrode 621 is disposed below gate electrode 606 in each FET trench 605. Shield electrode 621 is insulated from silicon region 602 by a shield dielectric 622 that is thicker than gate dielectric 620 lining upper sidewalls of FET trenches 605. Schottky trenches 607 include a snubber electrode 604 which is insulated from adjacent silicon regions 602 by a snubber dielectric layer 622. Snubber dielectric layer 622 may be formed at the same time that shield dielectric layer 622 in FET trenches 605 is formed, and thus has the same physical characteristics as the shield dielectric layer. Snubber dielectric layer 622 may be formed at a different process stage than when the shield dielectric is formed in order to obtain a snubber dielectric thickness that provides the desired snubber capacitance value (e.g., the snubber dielectric can be formed at the same time as gate dielectric layer 620). Also, snubber electrode 604 can be formed at the same time shield electrode 621 is formed or when gate electrode 606 is formed. Again, Schottky trenches 607 (or dummy trenches) and the snubber electrode and dielectric therein can be designed to obtain the desired snubber RC values.

Figure 7:
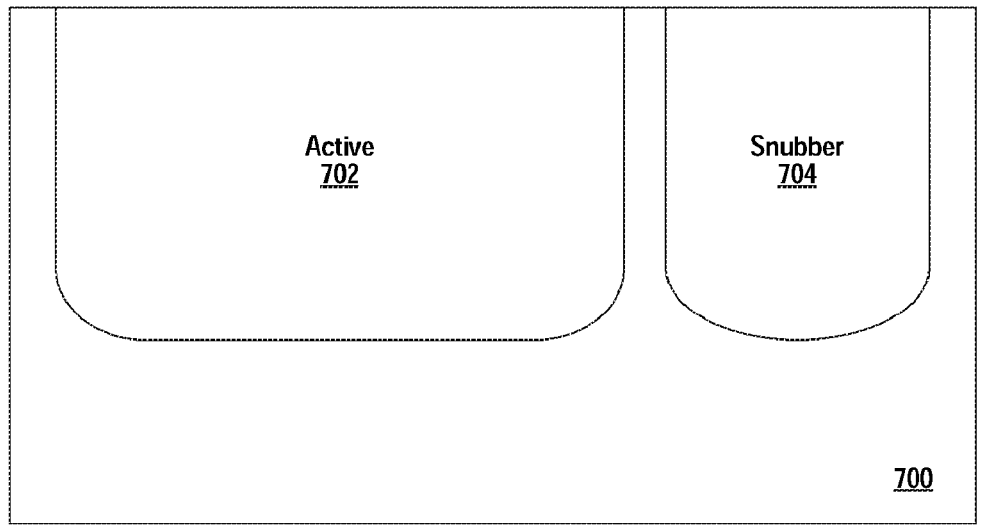
FIG. 7 is a cross section view showing a variation where the FET region and the RC Snubber are formed in separate regions of a die.

While in the various embodiments described herein the RC snubber is distributed throughout the active region (i.e., where the active cells are formed), a separate portion 704 of the die may be allocated solely to the RC snubber as shown in FIG. 7. This can be advantageous in that the FET and the RC snubber can be designed independent of each other thereby minimizing the potential adverse impact of competing interests when designing the FET and RC snubber. In an alternatively, the RC snubber may be advantageously formed under the gate pad area, or other similar areas where the active cells do not extend into, thus, minimizing silicon consumption.

Figure 8:
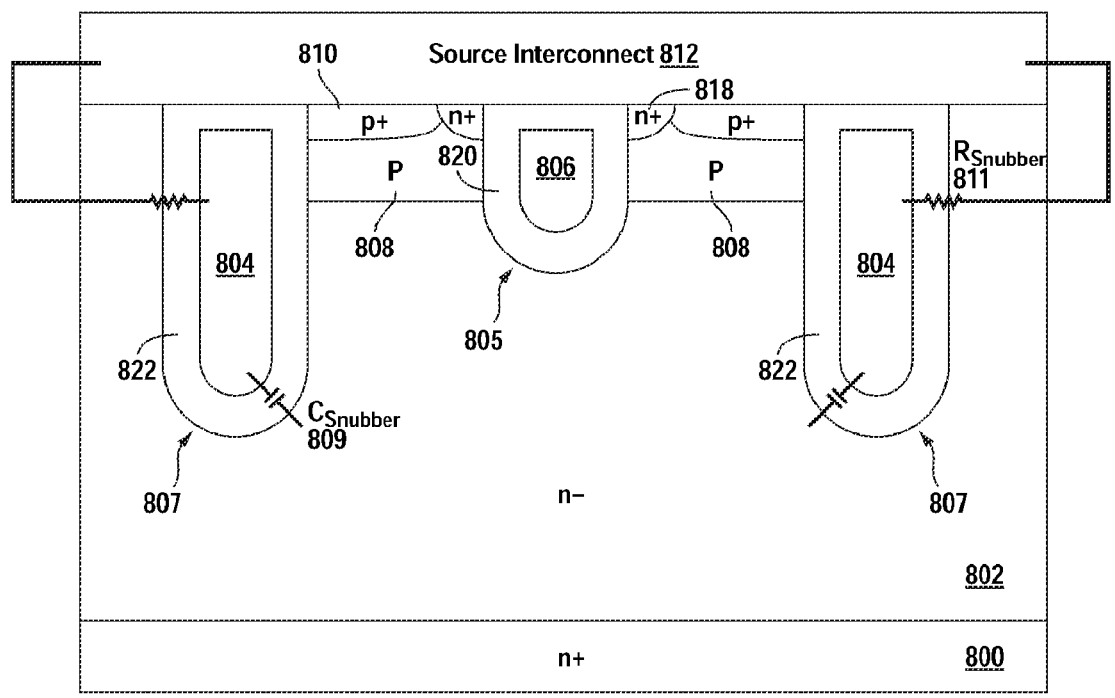
FIG. 8 shows an embodiment where trenches serving as charge balancing structures are advantageously used to also implement the RC snubber.

FIG. 8 shows an embodiment where trenches serving as charge balancing structures are advantageously used to also implement the RC snubber. As shown, the center FET trench 809 is surrounded by two deeper charge balance trenches 807. The snubber electrode 804 (e.g., comprising polysilicon) in the outer charge balance trenches can be tied to the source interconnect along a third dimension in a manner to obtain the desired snubber resistance. As with prior embodiments, snubber dielectric 822 may be formed at the same time as gate dielectric 820 or at a different stage of the process depending on the desired snubber capacitance value and the desired charge balance characteristics. Source regions 818, body regions 808, heavy body regions 810, and source interconnect 812 are configured relative to FET trench 805 in a similar manner to those in prior embodiments.

Figure 9:
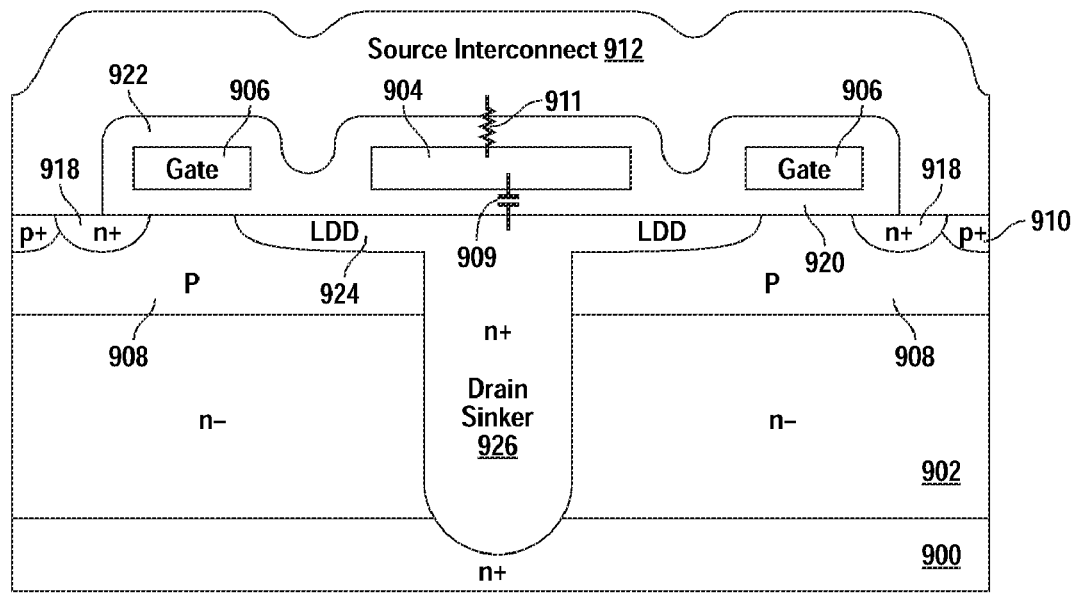
FIG. 9 shows a lateral MOSFET monolithically integrated with a RC snubber.

FIG. 9 shows a lateral MOSFET monolithically integrated with a RC snubber. As can be seen, a laterally extending snubber electrode 904 (e.g., comprising doped or undoped polysilicon) is included between two adjacent laterally extending gate electrodes 906 (e.g., comprising doped or undoped polysilicon). Snubber electrode 904 with an underlying dielectric layer 920 forms a snubber capacitor 909 with LDD region 924 and drain sinker region 926. Furthermore, snubber electrode 904 is connected to source interconnect 912 along a third dimension in a manner to obtain the desired snubber resistance. Source interconnect 912 is shown to extend down between adjacent electrodes 904, 906 to shield gate electrodes 906 from the drain. In another embodiment, source interconnect 912 does not extend down between adjacent electrodes 904, 906. Body regions 908 extend in silicon region 902, and source regions 918 extend in body regions 908 and overlap gate electrodes 906. Heavy body regions 910 extend in body regions 908 adjacent source regions 918. N-type LDD region 924 extends in body region 908 and overlaps gate electrodes 906. Highly doped drain sinker 926 extends vertically from LDD region down into substrate 900. Gate and snubber electrodes 906, 904 are insulated from underlying regions by a gate dielectric layer 920, and are insulated from source interconnect 912 by dielectric layer 922.

Figure 10:
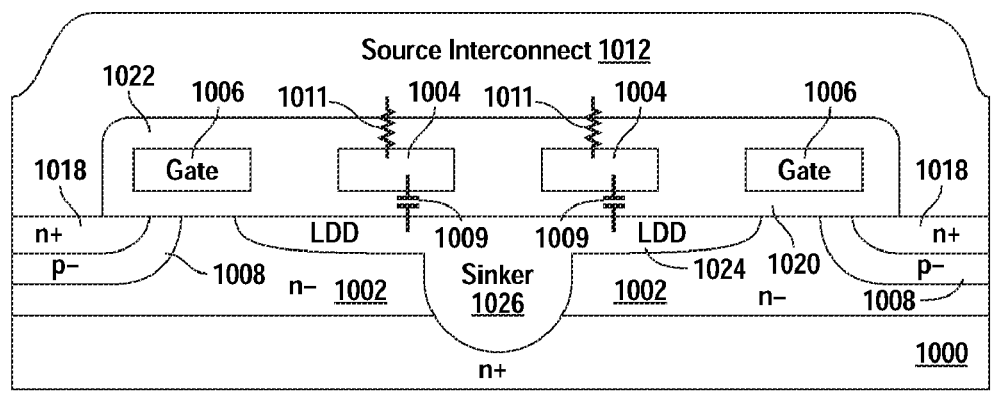
FIG. 10 shows another lateral MOSFET monolithically integrated with an RC snubber.

FIG. 10 shows another lateral MOSFET monolithically integrated with an RC snubber. In this embodiment, two middle electrodes 1004 (e.g., comprising doped or undoped polysilicon) which serve to influence the electric field in the drift region are also used to implement the RC snubber. These two snubber electrodes 1004 are tied to source interconnect 1012 in a manner to obtain the desired snubber resistance 1011, and also form the desired snubber capacitance 1009 with LDD and sinker regions 1024, 1026 across dielectric layer 1020. While FIG. 10 shows two snubber electrodes disposed between gate electrodes 1006, more snubber electrodes may be included depending on the desired snubber RC values. Unlike the lateral MOSFET in FIG. 9, body regions 1008 in FIG. 10 do not reach LDD regions 1024.

Figure 11:
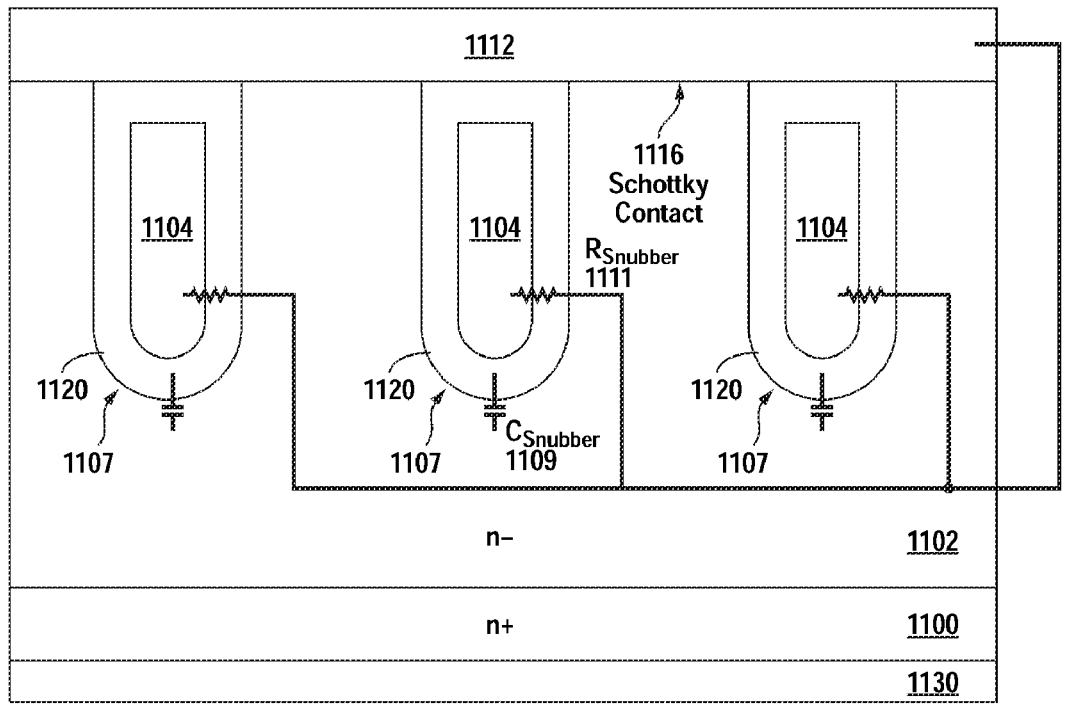
FIG. 11 shows a Trench MOS Barrier Schottky (TMBS) rectifier with a monolithically integrated RC snubber.

FIG. 11 shows a Trench MOS Barrier Schottky (TMBS) rectifier with a monolithically integrated RC snubber. Trenches 1107 extend into silicon region 1102, and include a dielectric layer 1120 lining the trench sidewalls and a recessed snubber electrode disposed in trenches 1107. Topside interconnect 1112 forms Schottky contacts with silicon regions 1102 along the mesa surfaces between adjacent trenches. Top side interconnect 1112 includes suitable known material for forming a Schottky barrier with silicon region 1102. The considerations in designing snubber trenches 1107 and the material therein so as to obtain the desired snubber RC values is similar to prior embodiments, and thus will not be repeated here.

Design Factors for Selecting the Resistance and Capacitance Values of the Monolithically Integrated RC Snubber In all of the embodiments described herein and their equivalents, the following criteria may be used in determining appropriate values for the snubber capacitor and the snubber resistor.

Resistance:

For the case of a typical discrete snubber network (i.e., not monolithically integrated), the snubber circuit is relatively complex (at least fourth order). But for the case of monolithically integrated snubber RC, the circuit reduces to an ideal series RLC second order network. Therefore, classical second order network design criteria can be used for guidance. For effective damping of a second order network, the damping resistance value for snubber R needs to be proportional to $\sqrt{L/C}$. In this equation, C represents the output capacitance of the FET (e.g., Coss in MOSFETs, or Coes in IGBTs) when turned off, and L is the sum of both PCB parasitics and device package parasitics. The combined total inductance will be fairly consistent across power supply designs for a given package type. This allows selecting a fixed value for R that shows effective performance across a range of designs. Detailed simulations, in accordance with some embodiments, have shown that for a typical synchronous buck power train, an R value of 0.5 to 2.0 Ohms will produce substantially improved snubbing for lower voltage applications (e.g., less than 50V). For higher voltage applications, higher R values provide better snubbing effect. Thus, it can be seen that the manner in which the snubber electrode is tied to the source (or emitter) interconnect needs to be carefully considered and designed so that the desired resistance value is obtained.

Capacitance:

To obtain effective snubbing, the snubber leg needs to have a lower impedance than that of the FET. Thus, the snubber capacitance value needs to be greater than the output capacitance of the FET (e.g., Coss in MOSFETs or Coes in IGBTs) when turned off. In some embodiments, effective snubbing is obtained with a snubber capacitance value 2-5 times greater than the output capacitance of the FET when turned off.

Figure 12:
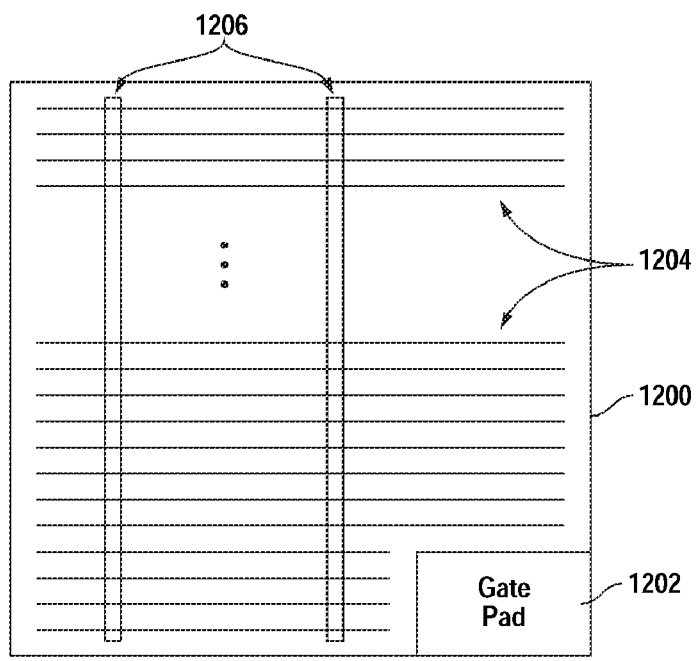
FIG. 12 shows a simplified top layout view of a die in which a power device is monolithically integrated with an RC snubber.

FIG. 12 shows a simplified top layout view of a die in which a power device is monolithically integrated with an RC snubber. Rows 1204 laterally extending through the active region of the die include rows of cells (e.g., including FET trenches) and rows of snubber electrodes (e.g., disposed in snubber trenches or over mesa regions) dispersed among the rows of cells. The number of rows of snubber electrodes relative to the number of rows of cells is in part determined by the target snubber capacitance value. That is, if a larger snubber capacitance value is desired, a larger number of rows of snubber electrodes are used, and vice versa.

In FIG. 12, contact regions 1206 vertically extend through the active region. Where contact regions 1206 intersect with laterally extending rows of snubber electrodes, contacts are formed between the top-side interconnect (e.g., source interconnect in the case of a MOSFET), not shown, and the snubber electrodes. At least two columns of contact regions 1206 may be necessary to reduce the snubber resistance to a value that would dampen the output ringing. Of course, more than two columns of contact regions may be used depending on the desired snubber resistance. In general, to obtain a lower snubber resistance, a greater number of columns of contact regions 1206 may be used. FIG. 12 is only one of many possible layout configurations in which various structural features can be manipulated to obtain the desired snubber RC values.

Figure 13A:
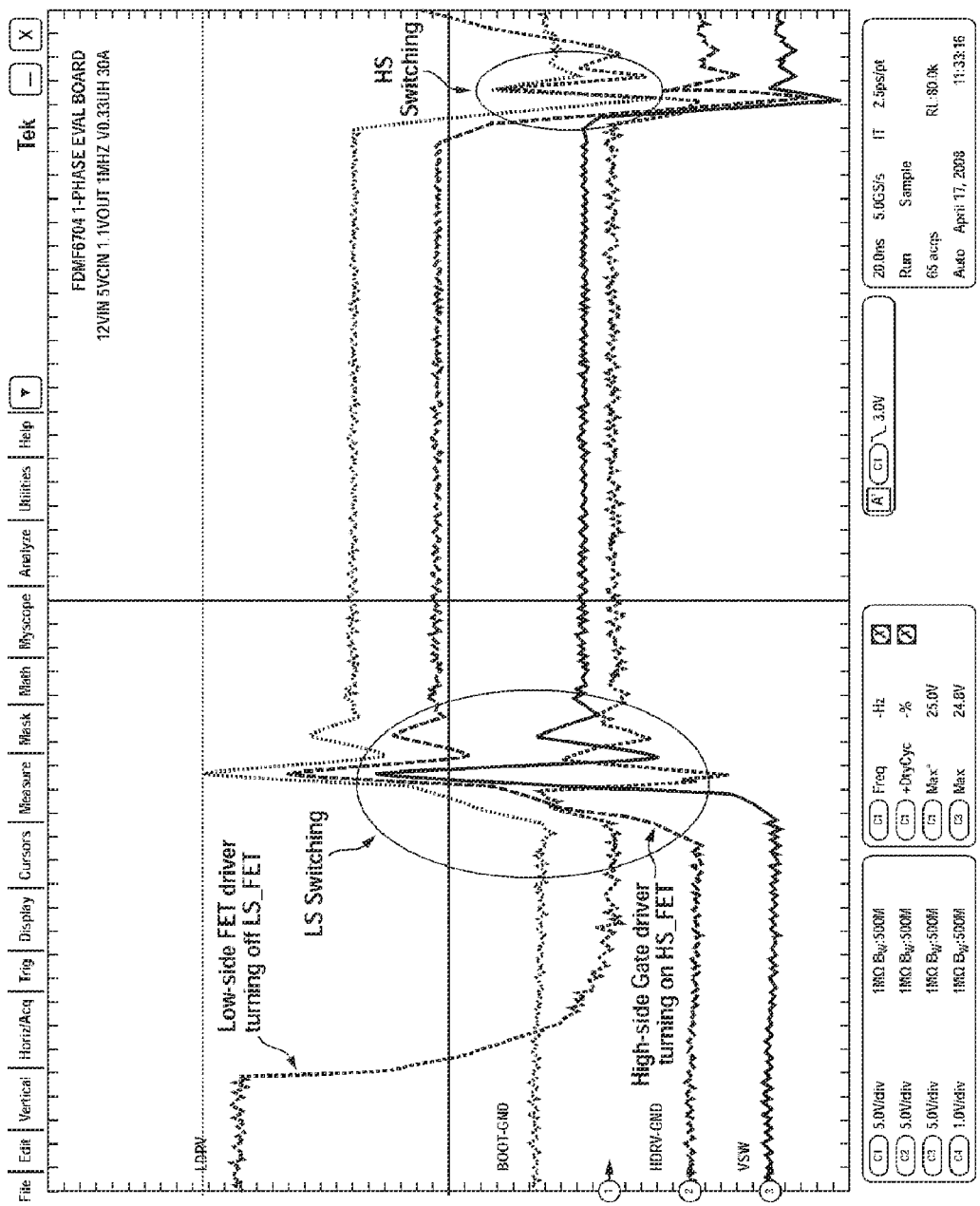
FIGS. 13A and 13B show measured results for a FET with a monolithically integrated RC snubber (left diagram) and for a FET with no RC snubber (right diagram).
Figure 13B:
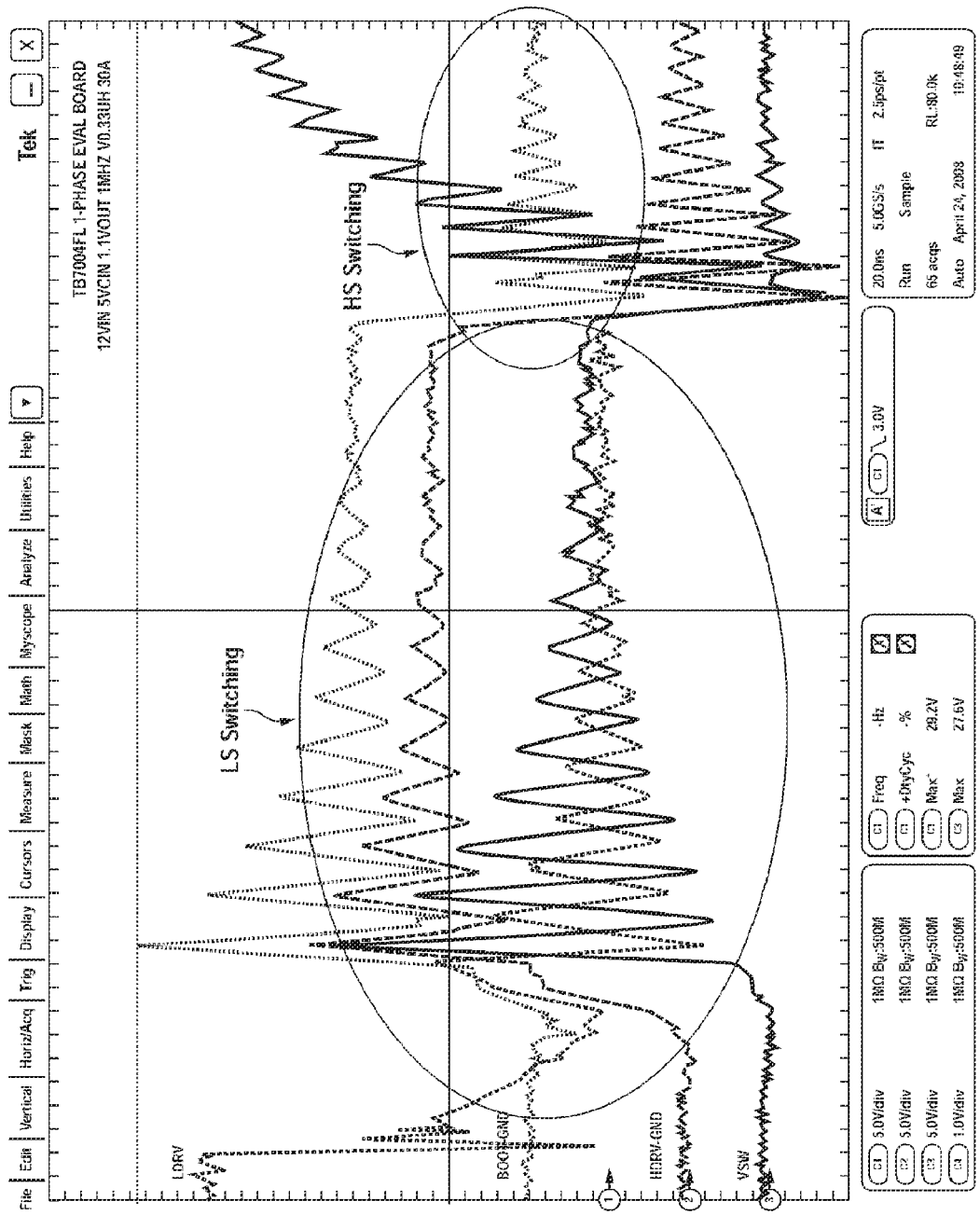

The monolithically integrated RC snubber and FET shows significant reduction in ringing compared to conventional discrete solutions. FIGS. 13A and 13B show measured results for a FET with a monolithically integrated RC snubber (left diagram) and for a FET with no RC snubber (right diagram). The impact of the RC snubber on the output ringing is clearly observable for both the HS_FET and LS_FET (conventional discrete snubber techniques only reduce low side ringing). Thus, not only does the monolithic implementation of the RC snubber provide far improved ringing characteristic as compared to conventional discrete solutions, but it also eliminates the need for external discrete capacitors and resistors and thus reduces cost.

The invention is not limited to the specific structures describe herein, and may be implemented in many other FET and IGBT structures. In particular, the RC snubber may be implemented in any power transistor structure where electrodes (other than the gate electrodes) are used to influence the electrical characteristics of the drift region, e.g., to improve charge balance and/or the transistor on-resistance (Rdson). These electrodes may be modified or configured so as to obtain the desired snubber resistor and capacitor values as discussed above. Therefore, the scope of the present invention should be determined not with reference to the above description but should instead be determined with reference to the appended claims, along with their full scope of equivalents.

What is claimed is:

1. A semiconductor structure, comprising:
a power transistor including:
a body region extending in a silicon region,
a gate electrode insulated from the body region by a gate dielectric,
a source region extending in the body region, the source region being of opposite conductivity type from the body region,
a source interconnect contacting the source region, and
a backside drain; and
an RC snubber monolithically integrated with the power transistor in a die, the RC snubber including:
a snubber electrode insulated from the silicon region by a snubber dielectric such that the snubber electrode and the silicon region form a snubber capacitor, the snubber electrode being connected to the source interconnect to form a snubber resistor between the snubber capacitor and the source interconnect, the gate electrode having a bottom surface at a depth shallower than a depth of a bottom surface of the snubber electrode, the RC snubber configured to substantially dampen output ringing when the power transistor switches states.

2. The semiconductor structure of claim 1, wherein the RC snubber includes a snubber trench with the snubber electrode disposed therein and the power transistor includes a gate trench with the gate electrode disposed therein, the snubber trench is aligned parallel to the gate trench,
the semiconductor structure further comprising:
at least two columns of contacts in contact with the source interconnect and the snubber electrode.

3. The semiconductor structure of claim 1, wherein the power transistor includes a gate trench, the gate trench includes the gate electrode and includes a shield electrode under the gate electrode.

4. The semiconductor structure of claim 1, wherein the RC snubber includes a snubber trench extending deeper than a gate trench included in the power transistor.

5. The semiconductor structure of claim 1, wherein the snubber electrode is recessed in a snubber trench of the RC snubber,
the semiconductor structure further comprising:
a dielectric cap insulating portions of the snubber electrode from the source interconnect.

6. The semiconductor structure of claim 1, wherein the RC snubber includes a snubber trench, and the power transistor includes a gate trench, the snubber trench has a depth the same as a depth of the gate trench, the RC snubber including a dielectric layer extending along a bottom of the gate trench thicker than the dielectric layer of the RC snubber.

7. The semiconductor structure of claim 1, wherein the RC snubber includes a snubber trench and the power transistor includes a gate trench, the snubber trench is included within rows of snubber trenches dispersed among rows of gate trenches including the gate trench.

8. The semiconductor structure of claim 1, wherein the power transistor is formed in an active region of the die, and the RC snubber is formed in a region extending under a gate pad electrically connected to the gate electrode.

9. The semiconductor structure of claim 1, wherein the snubber resistor has a resistance in a range of 0.5 to 2.0 ohms.

10. The semiconductor structure of claim 1, wherein the snubber resistor has a resistance value proportional to $\sqrt{L/C}$, where C represents an output capacitance of the power transistor when the power transistor is turned off, and L includes a parasitic inductance of a package in which the semiconductor structure is housed.

11. The semiconductor structure of claim 1, wherein the snubber capacitor has a capacitance value greater than an output capacitance of the power transistor when the power transistor is turned off.

12. A semiconductor die, comprising:
a power transistor including a gate electrode, a drain interconnect contacting a drain region on a backside of the semiconductor die, and a source interconnect contacting a source region;
an RC snubber monolithically integrated with the power transistor into the semiconductor die, the RC snubber including a snubber electrode aligned parallel to the gate electrode, the gate electrode having a bottom surface at a depth shallower than a depth of a bottom surface of the snubber electrode,
the snubber electrode being insulated from the drain region by a snubber dielectric such that the snubber electrode and the drain region form a snubber capacitor; and
at least two columns of contacts in contact with the source interconnect and in contact with the snubber electrode to form a snubber resistor.

13. The semiconductor die of claim 12, wherein the snubber resistor has a resistance in a range of 0.5 to 2.0 ohms.

14. The semiconductor die of claim 12, wherein the snubber resistor has a resistance value proportional to $\sqrt{L/C}$, where C represents an output capacitance of the power transistor when the power transistor is turned off, and L includes a parasitic inductance of a package in which the semiconductor die is housed.

15. The semiconductor structure of claim 1 wherein the snubber capacitor and the snubber resistor are configured in a distributed fashion.

16. The semiconductor die of claim 12, wherein the snubber capacitor and the snubber resistor function to substantially dampen output ringing when the power transistor switches states.

17. The semiconductor die of claim 12, wherein the RC snubber includes a snubber trench and a dielectric cap disposed over the snubber trench.

18. An apparatus, comprising:
a high-side switch including a high-side power transistor and a high-side RC snubber monolithically integrated in a die,
the high-side power transistor including:
a body region in a silicon region,
a gate electrode disposed in a gate trench and insulated from the silicon region by a gate dielectric,
a source region extending in the body region,
a source interconnect contacting the source region, and
a backside drain,
the high-side RC snubber including:
a snubber capacitor formed by a snubber electrode disposed in a snubber trench and insulated from the silicon region by a snubber dielectric, the gate electrode having a bottom surface at a depth less than a depth of a bottom surface of the snubber electrode, and
a snubber resistor formed by the snubber electrode being connected to the source interconnect; and
a low-side switch including a low-side power transistor and a low-side RC snubber.

19. The apparatus of claim 18, wherein the die is a first die, the low-side power transistor and the low-side RC snubber are monolithically integrated in a second die.

20. The apparatus of claim 18, wherein the high-side RC snubber is configured to substantially dampen output ringing when the power transistor switches states.

21. The semiconductor structure of claim 1, wherein the RC snubber includes a first snubber trench and a second snubber trench, the semiconductor structure further comprising:
- a Schottky contact formed between the first snubber trench and the second snubber trench.

22. A semiconductor structure, comprising:
- a power transistor including:
  - a body region extending in a silicon region,
  - a gate electrode insulated from the body region by a gate dielectric,
  - a source region extending in the body region, the source region being of opposite conductivity type from the body region,
  - a source interconnect contacting the source region, and
  - a backside drain; and
- an RC snubber monolithically integrated with the power transistor in a single die, the RC snubber including:
  - a snubber electrode insulated from the silicon region by a snubber dielectric such that the snubber electrode and the silicon region form a snubber capacitor, the gate electrode having bottom surface at a depth less than a depth of a bottom surface of the snubber electrode, the snubber electrode being connected to the source interconnect to form a snubber resistor between the snubber capacitor and the source interconnect,
the snubber capacitor having a capacitance value greater than an output capacitance of the power transistor when the power transistor is turned off.

23. The semiconductor structure of claim 1, wherein the RC snubber includes a snubber trench, the snubber trench includes the snubber electrode, the body region excludes a source region on a side of the body region contacting the snubber trench.

24. The semiconductor structure of claim 1, wherein the power transistor includes a gate trench, the gate trench includes the gate electrode and includes a shield electrode under the gate electrode, the shield electrode is insulated from the silicon region by a shield dielectric that is thicker than a gate dielectric lining an upper sidewall of the gate trench, the snubber electrode is insulated from the silicon region by a snubber dielectric having a thickness equal to or different than a thickness of the shield dielectric.

25. The semiconductor die of claim 12, wherein the power transistor includes a gate trench, the gate trench includes the gate electrode and includes a shield electrode.

26. The semiconductor die of claim 12, wherein the power transistor includes a gate trench with the gate electrode disposed therein, the RC snubber includes a snubber trench with the snubber electrode disposed therein, the snubber trench has a depth deeper than a depth of the gate trench.

27. The semiconductor die of claim 12, wherein the snubber electrode is recessed in a snubber trench of the RC snubber, and the gate electrode is recessed in a gate trench of the power transistor.

28. The semiconductor die of claim 12, wherein the RC snubber includes a first snubber trench and a second snubber trench, the semiconductor die further comprising:
- a Schottky contact between the first snubber trench and the second snubber trench.

29. The apparatus of claim 18, wherein the high-side power transistor includes a gate trench, the gate trench includes the gate electrode and includes a shield electrode.

30. The semiconductor structure of claim 22, wherein the power transistor includes a gate trench, the gate trench includes the gate electrode and includes a shield electrode.

31. The semiconductor structure of claim 22, wherein the power transistor includes a gate trench with the gate electrode disposed therein, the gate electrode is recessed in the gate trench, the RC snubber includes a snubber trench with the snubber electrode disposed therein, the snubber electrode is recessed in the snubber trench, the snubber trench has a depth deeper than a depth of the gate trench.

* * * * *

UNITED STATES PATENT AND TRADEMARK OFFICE
CERTIFICATE OF CORRECTION

| | | |
|---|---|---|
| PATENT NO. | : 8,829,624 B2 | Page 1 of 1 |
| APPLICATION NO. | : 12/492101 | |
| DATED | : September 9, 2014 | |
| INVENTOR(S) | : Jon Gladish et al. | |

It is certified that error appears in the above-identified patent and that said Letters Patent is hereby corrected as shown below:

On Title Page 2, in column 2, Item (56) under "Other Publications", line 2, delete "Corportaion," and insert -- Corporation, --, therefor.

In the Claims
In column 10, line 36, in claim 15, delete "claim 1" and insert -- claim 1, --, therefor.

Signed and Sealed this
Seventeenth Day of February, 2015

Michelle K. Lee
*Deputy Director of the United States Patent and Trademark Office*